US006339606B1

(12) United States Patent
Alphonse

(10) Patent No.: US 6,339,606 B1
(45) Date of Patent: Jan. 15, 2002

(54) HIGH POWER SEMICONDUCTOR LIGHT SOURCE

(75) Inventor: Gerard A. Alphonse, Princeton, NJ (US)

(73) Assignee: Princeton Lightwave, Inc., Cranbury, NJ (US)

( * ) Notice: Subject to any disclaimer, the term of this patent is extended or adjusted under 35 U.S.C. 154(b) by 0 days.

(21) Appl. No.: 09/158,847

(22) Filed: Sep. 23, 1998

Related U.S. Application Data

(60) Provisional application No. 60/089,454, filed on Jun. 16, 1998.

(51) Int. Cl.⁷ ................................................. H01S 5/00
(52) U.S. Cl. ........................................... 372/50; 372/46
(58) Field of Search ............................. 372/50, 46, 45, 372/23; 359/344; 385/131; 257/93

(56) References Cited

U.S. PATENT DOCUMENTS

| 4,349,905 A | * | 9/1982 | Ackley ........................ 372/46 |
| 4,713,821 A | | 12/1987 | Bradford et al. ............... 372/44 |
| 4,764,934 A | | 8/1988 | Kwong et al. ................. 372/46 |
| 4,789,881 A | | 12/1988 | Alphonse ..................... 372/44 |
| 4,793,679 A | | 12/1988 | Toda et al. ............... 350/96.15 |
| 4,821,276 A | | 4/1989 | Alphonse et al. .............. 372/45 |
| 4,821,277 A | | 4/1989 | Alphonse et al. .............. 372/45 |
| 4,852,113 A | * | 7/1989 | Botez .......................... 372/50 |
| 4,856,014 A | | 8/1989 | Figueroa et al. ............... 372/46 |
| 4,875,216 A | * | 10/1989 | Thornton et al. .............. 372/45 |
| 4,958,355 A | | 9/1990 | Alphonse et al. .............. 372/45 |
| 5,008,889 A | | 4/1991 | Wilson ......................... 372/32 |
| 5,202,948 A | * | 4/1993 | Suhara et al. ................ 385/131 |
| 5,223,722 A | | 6/1993 | Nagai et al. .................. 257/96 |
| 5,818,857 A | | 10/1998 | Palmer ......................... 372/32 |
| 5,953,357 A | * | 9/1999 | Hirata et al. .................. 372/46 |
| 6,018,536 A | * | 1/2000 | Alphonse et al. .............. 372/23 |

FOREIGN PATENT DOCUMENTS

| JP | 10-075011 | * | 3/1998 |
| JP | 10-107373 | * | 4/1998 |

OTHER PUBLICATIONS

International Search Report corresponding to PCT ApplicationPCT/US99/13568.

* cited by examiner

Primary Examiner—Quyen Leung
(74) Attorney, Agent, or Firm—Duane Morris; Arthur L. Plevy

(57) ABSTRACT

A semiconductor light source comprises superluminescent diodes (SLDs) disposed on a substrate having a facet, channels separating the SLDs, and a mode expander region. Each SLD has a diamond shaped active region such that the front and rear end of each SLD ends in a taper. The mode expander region is disposed on at least one side of the tapers of the SLDs and is tapered into a waveguide extending to said facet.

13 Claims, 5 Drawing Sheets

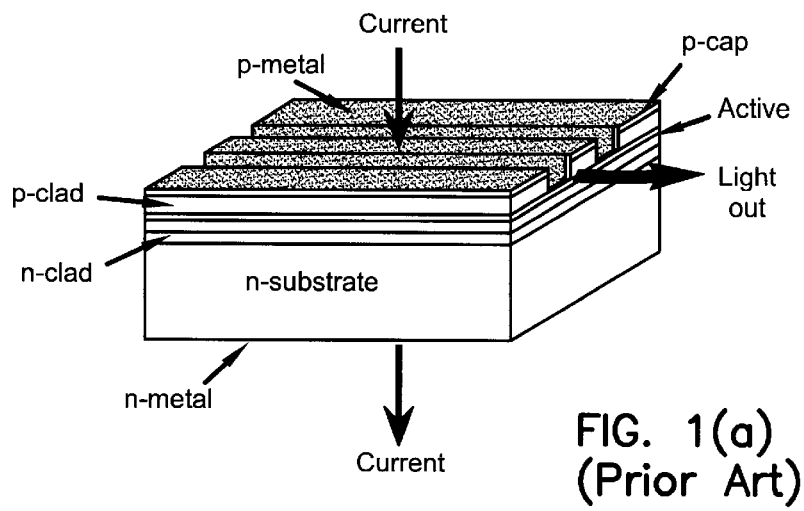
FIG. 1(a)
(Prior Art)
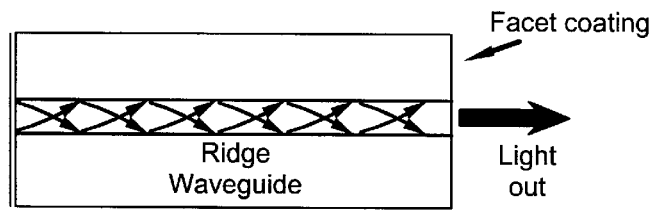
FIG. 1(b)
(Prior Art)
FIG. 1(c)
(Prior Art)
FIG. 1(d)
(Prior Art)

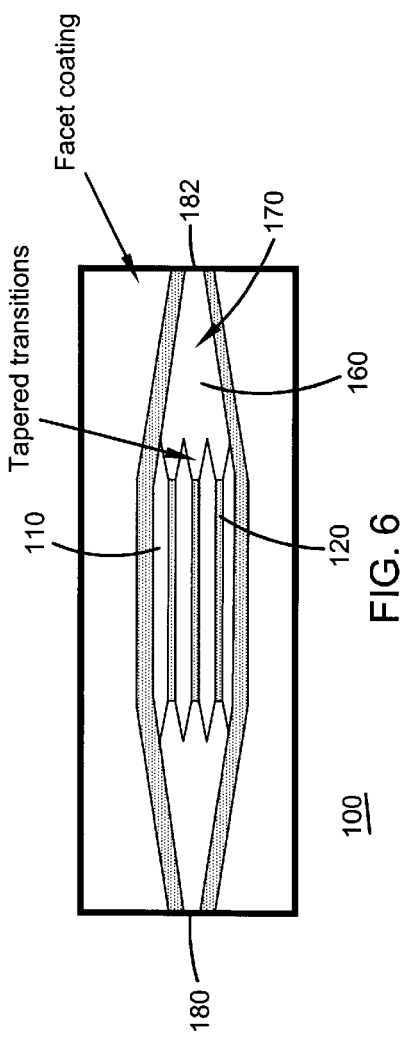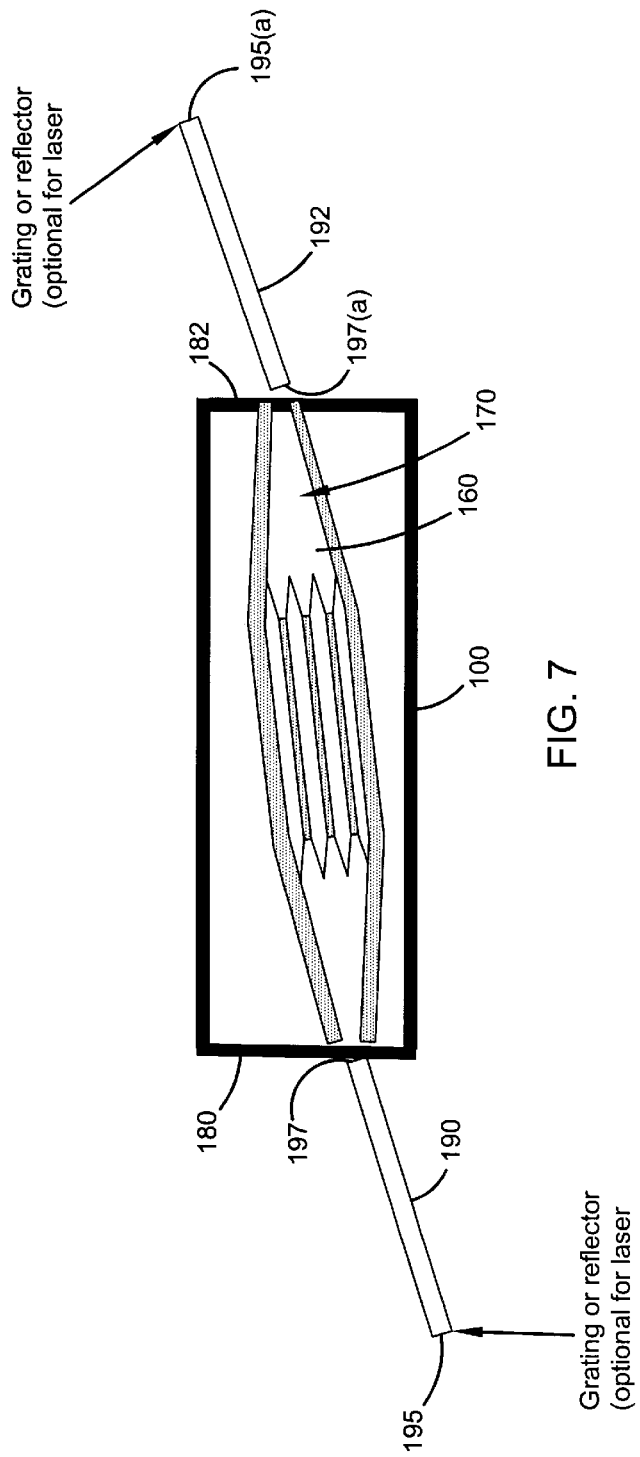

US 6,339,606 B1

HIGH POWER SEMICONDUCTOR LIGHT SOURCE

This application claims the benefit of U.S. Provisional Application No. 60/089,454, filed Jun. 16, 1998.

BACKGROUND OF THE INVENTION

1. Field of the Invention

The present invention relates to a semiconductor laser light source and, more particularly, to a semiconductor laser which uses a diamond active structure in a superluminescent diode (SLD) configuration as the gain medium to provide enough volume for high output power.

2. Description of the Prior Art

Semiconductor lasers and superluminescent diodes are intense, compact, and efficient light sources, with power density capability on the order of $10^7$ W/cm$^2$ generated in an active layer of thickness less than 1 $\mu$m. A semiconductor laser diode is made by first growing epitaxially on a substrate an active layer sandwiched between n-doped and p-doped cladding layers having slightly lower refractive index than the active layer and forming a waveguide structure through which electric current can flow. One convenient method of making the active waveguide is by etching channels in the structure, thus creating a ridge. Light is guided in the ridge by total internal reflection because the refractive index in the channels and the clad regions is slightly lower than the effective refractive index in the active region under the ridge. Typically, the walls of the ridge are parallel and the light is guided in a zigzag manner in the ridge at a certain number of discrete angles which define the propagating modes in the structure. To each mode is associated an effective index which is determined by the zigzag angle. The lowest mode is the one for which the zigzag angle is the smallest.

FIG. 1(a) is a perspective view a typical ridge waveguide laser or Fabry-Perot laser. FIG. 1(b) is a top view illustrating the propagation characteristics. In a Fabry-Perot laser, feedback for laser oscillations is provided by reflections from the facets. One of the facets is only partially reflective so that a portion of the light is emitted. The spectrum of the light is quite narrow, as shown in FIG. 1(c), often narrower than 1 Å. When the width of the ridge is within the range specified by equation (1) below, only the lowest order mode is allowed to propagate. The laser is then called single mode, and its output is a diffraction-limited beam with a Gaussian-like far-field pattern having a spatial distribution as shown in FIG. 1(d). Most applications require the laser to operate in a single mode.

In the laser of FIG. 1(a), the active waveguide is perpendicular to the facets. The same structure can be configured as a superluminescent diode (SLD) by processing the active waveguide at an angle with respect to the facets. FIGS. 2(a) and 2(b) illustrate the configuration of the same laser structure of FIG. 1(a) as an SLD. When the waveguide is not perpendicular to the facets, reflection from the facets is at an angle away from the waveguide, and only a very small fraction of the reflected light can be coupled into the waveguide. The waveguide ridge angle can be chosen to make the coupled reflected light as small as desired, as shown in FIG. 2(c). For example, the reflection is on the order of $10^{-6}$ if the waveguide is at an angle of about 6°. In the absence of reflection, there is no feedback, and the output is a broad spectrum spontaneous emission light as shown in FIG. 2(d).

The SLD is a light source with several important functions. First, it is an optical amplifier which can be used to amplify an optical signal by several orders of magnitude. Second, it is a broad band source which is used in several applications such as a light source for fiber optic gyroscopes and low coherence imaging. Third, it can be inserted into an external cavity (a space between two reflectors) to make lasers, including tunable lasers that are free from undesirable lasing modes that would be caused by facet reflection. This third function will be exploited in this invention.

Low power (a few milliwatts) semiconductor lasers having an active length less than about 500 $\mu$m and width of about 1 to 5 $\mu$m are widely used in CDs, CD-ROMs, optical data storage, and optical communications. However, new applications are emerging that require power on the order of about 10 to 100 watts in a single "guided" mode that can be readily coupled to a single mode fiber. Examples of such applications include light sources for projectors and laser printing. In view of their high saturation power density, such power is achievable in semiconductor laser materials by making the width of the active waveguide layer sufficiently large. For example, an active waveguide 1 mm wide and 1 $\mu$m thick would have an area of $10^{-5}$ cm$^2$ and would generate up to 100 watts of output power. However, such power is only obtainable in multimode operation and is not obtainable in a single mode.

As noted above, the wave propagates in several modes that are characterized by discrete zigzag angles in the waveguide, the lowest mode having the smallest zigzag angle. At any given wavelength, the number of modes is determined by the refractive indexes of the waveguide core and its surrounding cladding. In order to operate in its lowest single mode, the waveguide width d cannot exceed a certain minimum value. For a waveguide with core reflective index, $n_1$, clad reflective index $n_2$, and wavelength $\lambda$, the width for single mode operation is determined by equation (1):

$$d \leq \frac{\lambda}{2\sqrt{n_1^2 - n_2^2}} \tag{1}$$

For a typical laser with $n_1$=3.2 and $n_2$=3.195, d is less than 3 $\mu$m at 980 nm wavelength and the area for 1 $\mu$m thickness is less than about $3\times10^{-8}$ cm$^2$, so maximum output is on the order of about 0.3 watt. Thus, despite the high power capability of semiconductor laser materials, their output as single mode lasers is limited to only a fraction of a watt. Broad area lasers with about a 100 $\mu$m stripe width have been made with output power of several watts, and arrays can be made with still higher power, but they are multimode devices with limited usefulness. The present invention has been developed to harness the power available in a wide stripe active region to create a high power laser (about 10 to about 100 watts) with single mode output.

SUMMARY OF THE INVENTION

The present invention is directed to a semiconductor light source comprising a plurality of superluminescent diodes (SLDs) disposed on a first conductivity type substrate having a facet, each SLD having a diamond shaped active region such that the front and rear end of each SLD ends in a taper; a plurality of channels respectively separating the SLDs; and a mode expander region disposed on at least one side of the tapers of the SLDs. The mode expander region is tapered into a waveguide extending to the facet. The mode expander may be used for moderate power, such as less than about 3 to 5 watts, and is desired for high power. In accordance with one aspect of the present invention, a mode filter, preferably a single mode optical fiber, with a mechanism for optical feedback in that mode, is coupled to the facet.

BRIEF DESCRIPTION OF THE DRAWINGS

The present invention will be better understood after reading the following detailed description of the presently preferred embodiments thereof with reference to the appended drawings, in which:

FIGS. 1(a) and 1(b) illustrate a side perspective view and a top view, respectively, of a prior art Fabry-Perot semiconductor laser.

FIG. 1(c) shows the output spectrum of the laser of FIG. 1(a).

FIG. 1(d) shows the spatial distribution of the laser of FIG. 1(a).

FIG. 6 illustrates a preferred implementation of the present invention to generate high power comprising a monolithic array of several individual ridge diamonds in parallel, separated by narrow channels.

FIG. 7 illustrates a preferred configuration in accordance with the present invention showing the pattern of FIG. 6 in an SLD configuration, with two lengths of single mode fiber coupled to the outputs at the two facets.

DETAILED DESCRIPTION OF THE PREFERRED EMBODIMENTS

A system and method which meets the above-mentioned objects and provides other beneficial features in accordance with the presently preferred exemplary embodiment of the invention will be described below with reference to FIGS. 3–7. Those skilled in the art will readily appreciate that the description given herein with respect to those figures is for explanatory purposes only and is not intended in any way to limit the scope of the invention.

The objectives of this invention are accomplished by creating a basic structure to generate power in a broad area active waveguide with means to prevent the structure from generating high order modes, such as a "diamond" structure, and means to "adiabatically" (i.e., slowly, by means of a taper) transfer power to a "mode expander" waveguide having a relatively large cross-sectional area. Means are also provided to monolithically combine the basic structure into a larger passive structure as desired, and to adiabatically taper this larger passive structure into a single mode waveguide. In the case of a laser, means are further provided for ensuring that feedback is provided only at the desired oscillating mode.

As discussed in the background above, the output power of a single mode laser is limited to a fraction of a watt because of the small volume occupied by the active waveguide, as determined by the width requirement for single mode operation, due to the zigzag nature of the propagation. Making the guide wider increases the number of propagating modes, and generates mode output power, but the extra power is wasted because it cannot be coupled to an external structure such as a single mode optical fiber. To prevent the generation of high order modes, it is desirable to prevent the zigzag propagation.

A detailed description of a "diamond"-shaped SLD which is a dual-taper structure that achieves the objective of preventing the propagation of high order modes can be found in co-pending, commonly assigned U.S. patent application Ser. No. 08/857,920 now abandoned. This pending application is hereby incorporated by reference in its entirety. Here, diamond-shaped refers to a substantially rhombus, rhomboid, substantially hexagonal or parallelogram shaped structure, as viewed in two dimensions.

Figure 2A:
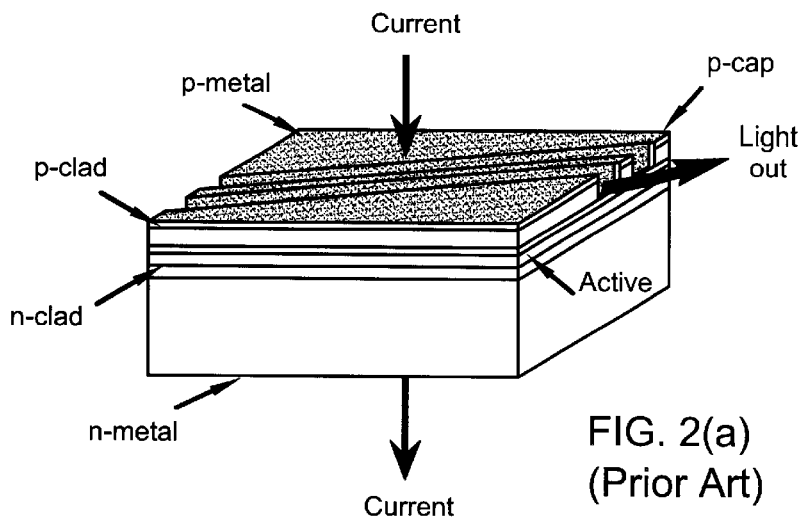
FIGS. 2(a) and 2(b) illustrate a side perspective view and a top view, respectively, of a prior art superluminescent diode (SLD).
Figure 2B:
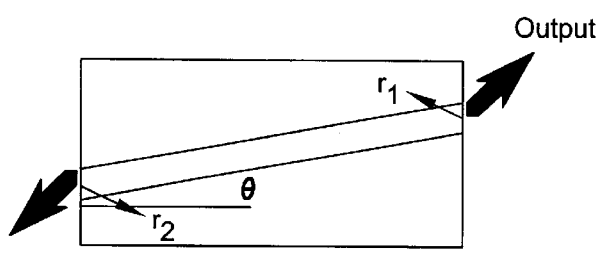
Figure 2C:
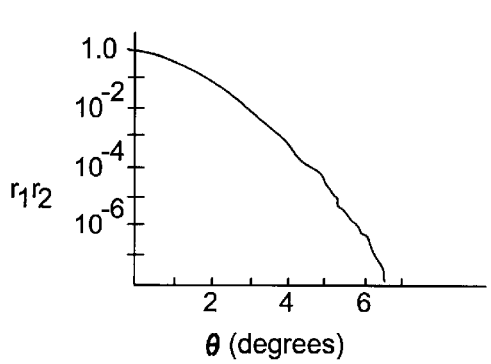
FIG. 2(c) shows the reflection vs. angle for the SLD of FIG. 2(a).
Figure 2D:
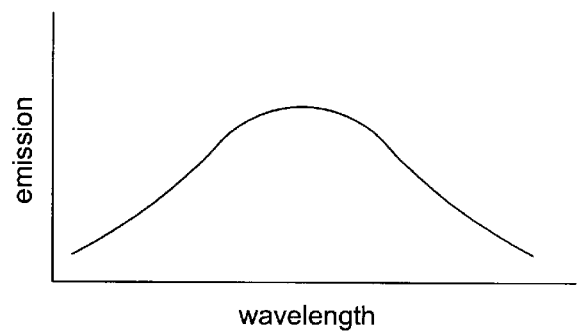
FIG. 2(d) shows the output spectrum of the SLD of FIG. 2(a).
Figure 3:
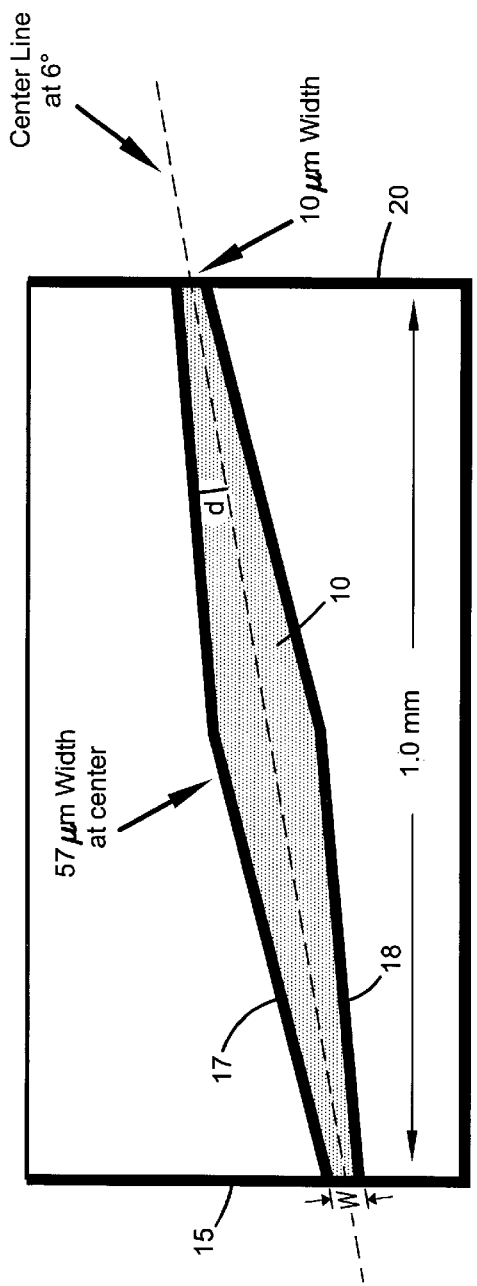
FIG. 3 illustrates a top view of an exemplary diamond SLD in accordance with the present invention.

FIG. 3 is a top view of an exemplary diamond SLD designed for operation at about 830 nm. The SLD 10 has a length of about 1.0 mm, with a waist of about 57 $\mu$m at the center and width of about 10 $\mu$m at each facet 15, 20. The taper angle $\alpha$ for both halves of the diamond is chosen to be less than the zigzag angle of the lowest mode to ensure that the zigzag pattern is prevented. A taper angle $\alpha$ of less than about 3° with respect to the center line of the diamond is shown in FIG. 3 in order to prevent radiation losses. The whole diamond itself is placed at an angle $\theta$ with respect to the facets. The stripe angle $\theta$ is preferably less than the critical angle at the facet, which is about 15°. A preferred stripe angle $\theta$ is in the range between about 5 and 10°. The taper angle $\alpha$ is the angle between the wall of the diamond and the stripe axis, and the stripe angle $\theta$ is the angle of the stripe axis with respect to the normal of the facet.

Figure 4:
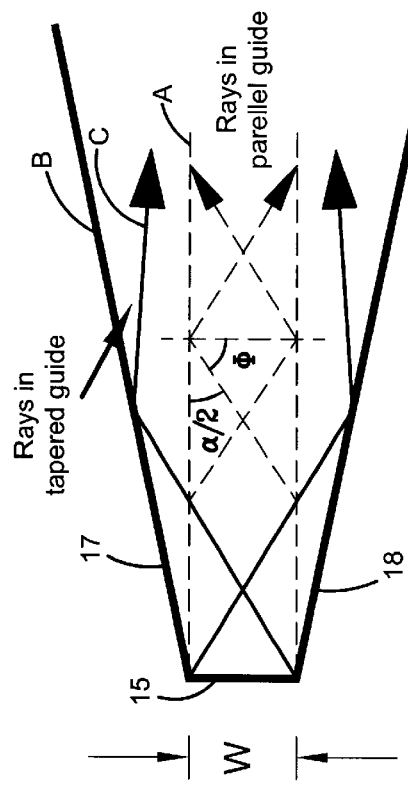
FIG. 4 illustrates the collimating effect of a tapered waveguide which prevents zigzag propagation in accordance with the present invention.

The method by which zigzag propagation is prevented is illustrated in FIG. 4. The dashed lines A in FIG. 4 illustrate a guide with parallel walls and the zigzag propagation of the light rays in it. The lines B show a portion of the diamond near the left facet 15, and the solid lines C show how the ray reflected from one wall 17 is diverted from the opposite wall 18, thus preventing zigzag propagation. In fact, the taper reduces the angle and effectively collimates the light.

With a width of about 10 $\mu$m (and a cross-sectional area of about $10^{-7}$ cm$^2$) at the facet 15, the SLD of FIG. 3 operates at an output power of more than about 175 mW, and when configured with reflecting mirrors to operate as a laser, it produces output power on the order of about 1.8 W with a Gaussian-like profile. Additional power could be extracted if the active taper were truncated at a point where the cross-section is still large and the field were allowed to expand into a lossless passive waveguide which is thicker than the active layer, and which can be tapered to the desired final dimension.

One objective of the present invention is achieved by combining the concept of the diamond double-taper structure of FIG. 3 with that of a mode expander (modex) in order to extract substantially all the available power into a Gaussian output. The mode expander reduces the power density to drive higher power. A complete description of an SLD with mode expander can be found in co-pending, commonly assigned U.S. patent application Ser. No. 08/946,180 now U.S. Pat. No. 6,034,380. This pending application is hereby incorporated by reference in its entirety. The combination of a diamond structure with a mode expander to capture the power into a thick passive waveguide is illustrated in FIGS. 5(a) and 5(b).

Figure 5A:
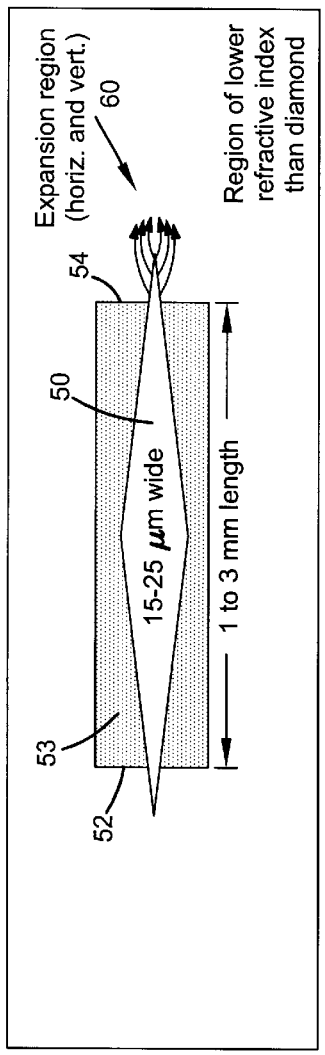
FIGS. 5(a) and 5(b) illustrate the combination of a diamond structure with a mode expander to capture the power into a thick passive waveguide in accordance with the present invention.

FIG. 5(a) shows a truncated diamond SLD structure 50 with a mode expander region 60 in a semiconductor chip 40. In FIG. 5(a), a diamond ridge structure 50 is shown which is similar to the SLD structure 10 in FIG. 3 except that the diamond terminates somewhere within the modex region 60 in the semiconductor structure 40 instead of extending to the facets 52, 54. The refractive index of the region 60 outside the diamond is slightly lower than the index of the diamond 50. As a result, as the optical field generated in the diamond SLD 50 approaches the tip of the diamond, it expands out of the diamond and into the low refractive index modex region 60 where it can propagate away from the diamond 50. This part of the structure is lossless and passive.

Figure 5B:
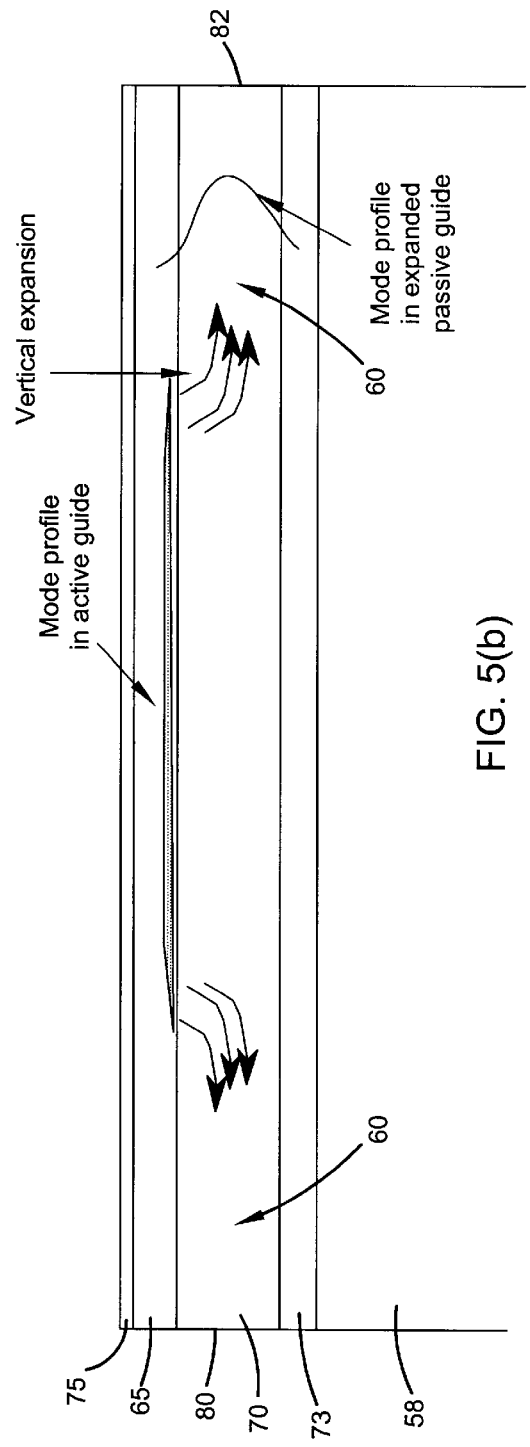

FIG. 5(b) shows a side view of the structure of FIG. 5(a) and shows the transition to the mode expander region 60. FIG. 5(b) shows the layer structure of the device and the behavior in the expansion region 60. An ordinary laser or SLD contains typically only one cladding layer on the p-side and n-side of an active layer which contains the quantum structure making up the SLD. In accordance with the present invention, an n-cladding layer is disposed on a substrate 58, and the n-cladding layer consists of two parts: one thick layer 70 ("thick guide") having a slightly lower refractive index than the diamond as discussed above, and another layer 73 ("outer n-clad") having the same n-doping but slightly different composition to give it a slightly lower refractive index than the thick guide 70. A typical, low refractive index p-cladding layer 65 is then grown or deposited over the active layer of the diamond SLD structure 50. A capping layer 75 is then disposed over the p-cladding layer 65.

Due to the fact that the refractive index of the p-cladding layer 65 and outer n-clad 73 is lower than the index of the thick guide 70, the optical field is guided in the thick guide 70 by the p-clad 65 and outer n-clad 73, and propagates toward the facets 80, 82 in the thick guide 70. Whereas the active layers of the SLD structure 50 may have a total thickness of less than one micron, the thickness of the thick guide 70 can be several microns, typically about 3 to 4 microns. In essence, high power, close to the saturation power density, is generated in the diamond SLD 50 with a field configuration that is equivalent to a single waveguide mode, and the power is extracted from the active region where the power density is high into the lossless region 60 of much higher saturation power density by virtue of the mode expansion. If the waist of the diamond is on the order of about 20 $\mu$m, and its length on the order of about 2 mm, the generated power will be on the order of about 3 to 4 watts, and most of it can be captured by the mode expander 60 using a taper (e.g., having a length of about 0.1 mm to about 0.2 mm) as shown in FIG. 5(a).

Without lateral guiding, the field would expand laterally to the facet and be emitted with an angular width determined by the taper angle of the diamond. Lateral guiding can be provided by extending the channel region 53 in FIG. 5(a) toward the facet, or by adiabatically tapering it to the desired output beam size near the facet.

Referring to FIG. 5(b), the device is typically composed of binary group III-V compounds such as GaAs, InP, and alloys of such compounds. In a GaAs system, the substrate 58 is typically composed of n-type GaAs about 100 $\mu$m thick and has a first major surface parallel to or slightly misoriented from the (100) crystallographic plane. The cladding layers 65, 70, and 73 typically comprise $Al_xGa_{1-x}As$ where x is generally between about 0.3 and 0.4, and more typically about 0.4. The active layer is typically about 0.08 $\mu$m thick and typically comprises $Al_xGa_{1-x}As$ where x is generally between about 0 and 0.1, depending on the wavelength to be emitted. The capping layer 75 is typically about 0.5 $\mu$m thick and typically comprises n or p-type GaAs. In an InP structure, the layers would be $In_xGa_{1-x}As_yP_{1-y}$, with x and y appropriately chosen for the desired wavelength of operation.

In accordance with the present invention, a high power single mode structure is created from this geometry and the output is shaped to satisfy the condition for efficient coupling to an external device, such as a single mode fiber. Additional power can be generated from the diamond structure 50 by making its waist larger. However, transition from the diamond 50 to the mode expander 60 does not occur until the width of the diamond is less then about 5 $\mu$m, at which point the available power may exceed saturation. The problem may be overcome by shaping the diamond tip in the form of several teeth, so that the optical field can start escaping the active region while it still has a broad width. However, a problem of "filamentation" occurs in broad area structures that can significantly reduce the operating life of the device. At very high power density, slight impurities and slight refractive index variations can be induced by the drive current, which cause local variations in the power density. These variations in turn cause "hot spots" or filaments where the material is degraded and has higher absorption. The degraded regions slowly widen in time, causing heating which eventually leads to catastrophic failure. In order to obtain high power and maintain reliability, it is preferable to use several relatively narrow active diamond stripes, and combine them in parallel. In this manner, if a stripe burns out due to localized defects, it does not affect the other stripes.

FIG. 6 shows a preferred structure 100 to generate high power in which a monolithic array of several individual tapered thin active ridge diamond structures 110 is provided in parallel, separated by narrow channels 120. The length of the diamond structures 110 need not be the same. The width of the diamonds at the waist is preferably about 20 to 30 $\mu$m. The width of the channels 120 can be as narrow as about 5 $\mu$m. The width should be sufficient to prevent overlapping of the fields of the individual diamond structures 110, while allowing overlap in the thick passive waveguide mode expander region 160 beyond the individual tapered transitions. The mode expander region 160, which contains the combined power from all the individual diamonds, is shaped into a relatively long (about 1 to 2 mm) tapered waveguide and created in the thick waveguide passive region in order to produce an additional taper 170 to achieve the desired mode size at the facets 180, 182.

The configuration shown in FIG. 6 is sufficient to produce a laser. All that is needed is to apply appropriate facet coating to provide feedback. However, it may not be sufficient to ensure that substantially all the available power will be in a single lateral mode. To achieve single mode, it is desirable to provide a section of single mode guide to filter out any high order mode and ensure that feedback is provided only for the desired lowest mode of the guide. The length of such a guide is preferably on the order of several centimeters, but can be any length. One method of providing this single mode filter is to couple a length of single mode fiber to the structure 100. However, it is important to avoid reflection from the facets 180, 182 which could cause oscillations to occur at some undesired modes. In order to achieve this, the array of the individual diamond structures 110 can be configured as an SLD by processing it at an angle (about 5° to 10°) with respect to the center line of the waveguide 170. FIG. 7 illustrates this preferred configuration.

FIG. 7 shows the preferred structure 100 in an SLD configuration, with two lengths of single mode fiber 190, 192 coupled to the outputs at the two facets 180, 182. The single mode fibers 190, 192 act as mode filters, as described above. The output dimensions of the tapered thick passive waveguide 170 are on the order of about 3 μm×6 μm, which is sufficient to couple over about 80% of the available light in the fibers 190, 192. The passive taper 170 has a much higher power density capability than the active diamond material because it has low loss. If each element provides about 3 to 4 watts, then it takes only about 25 to 30 elements to provide about 100 watts of output light. Because of the small overall dimensions of the chip (about 2 mm×4 mm, including guard spaces and channels), a 3 inch diameter wafer yields over 400 chips at a time, thus resulting in a low cost device.

In order to make a laser from the structure of FIG. 7, the tip on one of the fiber mode filters 190, 192 preferably is coated with a high reflective mirror or configured as a high reflective grating 195 and 195(a), and the other tip would be provided with a partial reflect mirror or grating 197 and 197(a). This provides feedback only at the mode that can propagate in the fiber regardless of the number of modes that can propagate in the semiconductor structure 100. The result is a high power single mode laser, with output power determined by the number of elements in the structure. The full width half maximum beam divergence of the output light is determined by the fiber numerical aperture and is on the order of about 15°. Slope efficiency is on the order of one watt/ampere at an applied voltage of about 2 volts. It should be noted that in order to make the pump provide multimode output, with a specific number of modes, the single mode fibers 190, 192 can be replaced by an appropriate length of multimode fiber. Thus, the pump is a diamond SLD with a section of fiber and feedback to establish a specific mode pattern in which the light source will lase.

There are numerous applications for a 10 to 100 watt semiconductor laser. Without feedback, the device functions as an SLD with output power typically being about one-quarter the equivalent laser power for the same drive current, and has applications to low coherence medical imaging, smart structures, and time domain reflectometry. Applications as lasers include direct computer to plate printing, surgery, and a light source for electronic projection systems.

In view of the above, the basic concept of the semiconductor laser in accordance with the invention is to use a diamond active structure in an SLD configuration as the gain medium to provide enough volume for high output power. The SLD configuration prevents feedback from the facets that would otherwise cause laser oscillations at undesired modes. Modal control and feedback are provided by a device such as a fiber structure that is external to the semiconductor chip.

Although illustrated and described herein with reference to certain specific embodiments, the present invention is nevertheless not intended to be limited to the details shown. Rather, various modifications may be made in the details within the scope and range of equivalents of the claims and without departing from the invention. Thus, other semiconductor materials or other compositions of the chosen semiconductor materials than those mentioned in the examples may be used.

Also, the conductivity types may all be (simultaneously) replaced by their opposites. Apart from the manufacturing methods given here, variants to these methods are also available to those skilled in the art, while also other techniques, for example for providing the semiconductor layers, may advantageously be used.

I claim:

1. A semiconductor light source comprising:
    a plurality of superluminescent diodes (SLDs) disposed on a first conductivity type substrate having a facet, each SLD having a diamond shaped active region such that the front and rear end of each SLD ends in a taper;
    a plurality of channels respectively separating said SLDs; and
    a mode expander region disposed on at least one side of said tapers of said SLDs, said mode expander region tapered into a waveguide extending to said facet.

2. The semiconductor light source of claim 1, wherein said SLDs are arranged in a monolithic array.

3. The semiconductor light source of claim 1, wherein each said SLD comprises:
    a structure comprising a first conductivity type first cladding layer, an active layer, and a second conductivity type second cladding layer, successively disposed on said substrate;
    wherein said structure is arranged to direct an optical field emitted from said active layer into said mode expander region.

4. The semiconductor light source of claim 3, wherein first cladding layer comprises a first layer and a second layer, said first layer having a lower refractive index than said second layer, said second layer disposed over said first layer.

5. The semiconductor light source of claim 1, wherein each of said channels has a width sufficient to prevent overlapping of said optical fields of said SLDs while allowing overlap in said expander region.

6. The semiconductor light source of claim 1, wherein each of said channels has a width of about 5 μm.

7. The semiconductor light source of claim 1, wherein said waveguide is single mode.

8. The semiconductor light source of claim 1, further comprising a facet coating on said facet.

9. The semiconductor light source of claim 1, wherein said waveguide is disposed at an angle with respect to said facet.

10. The semiconductor light source of claim 9, wherein said angle has a value in the range between about 5° and about 10°.

11. The semiconductor light source of claim 1, further comprising a mode filter coupled to said facet.

12. The semiconductor light source of claim 11, wherein said mode filter is an optical fiber having a first end near said waveguide and a second end away from said waveguide.

13. The semiconductor light source of claim 12, further comprising one of a partial reflect mirror and a partial reflect grating on said first end of said optical fiber, and one of a reflective mirror and reflective grating on said second end of said optical fiber.

* * * * *